United States Patent
Oki et al.

(10) Patent No.: US 9,530,859 B2
(45) Date of Patent: Dec. 27, 2016

(54) SEMICONDUCTOR DEVICE AND MANUFACTURING METHOD OF SAME

(71) Applicants: Shuhei Oki, Nagakute (JP); Tsuyoshi Nishiwaki, Nagakute (JP)

(72) Inventors: Shuhei Oki, Nagakute (JP); Tsuyoshi Nishiwaki, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/086,301

(22) Filed: Nov. 21, 2013

(65) Prior Publication Data

US 2014/0145239 A1    May 29, 2014

(30) Foreign Application Priority Data

Nov. 27, 2012 (JP) ................. 2012-258740

(51) Int. Cl.
| H01L 21/22 | (2006.01) |
| H01L 29/739 | (2006.01) |
| H01L 29/66 | (2006.01) |
| H01L 29/36 | (2006.01) |

(52) U.S. Cl.
CPC ......... *H01L 29/66348* (2013.01); *H01L 29/36* (2013.01); *H01L 29/7397* (2013.01)

(58) Field of Classification Search
None
See application file for complete search history.

(56) References Cited

U.S. PATENT DOCUMENTS

| 6,229,196 B1* | 5/2001 | Shishido et al. ............ 257/617 |
| 2005/0059263 A1 | 3/2005 | Nakazawa et al. |
| 2010/0173476 A1 | 7/2010 | Nakazawa |
| 2012/0032305 A1* | 2/2012 | Kitamura ................ 257/607 |

FOREIGN PATENT DOCUMENTS

| JP | A-11-54519 | 2/1999 |
| JP | A-2005-223301 | 8/2005 |
| JP | A-2008-244329 | 10/2008 |
| JP | A-2010-141136 | 6/2010 |
| JP | A-2012-69983 | 4/2012 |

* cited by examiner

*Primary Examiner* — Raj R Gupta
(74) *Attorney, Agent, or Firm* — Oliff PLC

(57) ABSTRACT

A manufacturing method for a semiconductor device including a drift layer; a body layer contacting a front surface of the drift layer; an emitter layer provided on a portion of a front surface of the body layer and exposed on the front surface of the substrate; a buffer layer contacting a back surface of the drift layer; a collector layer contacting a back surface of the buffer layer and exposed on a back surface of the substrate; and a gate electrode facing, via an insulator, the body layer in an area where the body layer separates the emitter layer from the drift layer, includes preparing a wafer that includes a first layer, and a second layer layered on a back surface of the first layer and having a higher polycrystalline silicon concentration than the first layer, and forming the buffer layer by implanting and diffusing ions in the second layer.

3 Claims, 8 Drawing Sheets

SEMICONDUCTOR DEVICE AND MANUFACTURING METHOD OF SAME

INCORPORATION BY REFERENCE

The disclosure of Japanese Patent Application No. 2012-258740 filed on Nov. 27, 2012 including the specification, drawings and abstract is incorporated herein by reference in its entirety.

BACKGROUND OF THE INVENTION

1. Field of the Invention

The invention relates to a semiconductor device and a manufacturing method thereof.

2. Description of Related Art

In a semiconductor device in which an IGBT is formed, a buffer layer is formed between a drift layer and a collector layer to ensure voltage-resistance and the like. As described in Japanese Patent Application Publication No. 2010-141136 (JP 2010-141136 A), a buffer layer is typically formed by implanting impurity ions of a first conductivity type in part of a region that will become a drift layer of the first conductivity type of a semiconductor wafer.

When a buffer layer is formed by implanting impurity ions in the semiconductor wafer, if there is a location where there is a scratch on a surface of the semiconductor wafer on the side where the impurity ions are implanted, the buffer layer will become thin at this location. If the thickness of the buffer layer becomes thin, voltage resistance of the semiconductor device will tend to decrease. One method to increase the thickness of the buffer layer is to perform an annealing process for an extended period of time at a high temperature after the ion implantation. However, if a semiconductor substrate is kept at a high temperature for an extended period of time, a device structure already formed in an earlier process may become polluted or the like.

SUMMARY OF THE INVENTION

A first aspect of the invention relates to a manufacturing method for a semiconductor device that includes a drift layer of a first conductivity type; a body layer of a second conductivity type that contacts a front surface of the drift layer, and a portion of which is exposed on a front surface of a semiconductor substrate; an emitter layer of a first conductivity type that is provided on a portion of a front surface of the body layer, and is exposed on the front surface of the semiconductor substrate, and that is separated from the drift layer by the body layer; a buffer layer of a first conductivity type that contacts a back surface of the drift layer; a collector layer of a first conductivity type that contacts a back surface of the buffer layer and is exposed on a back surface of the semiconductor substrate; and a gate electrode that faces, via an insulating film, the body layer in an area where the body layer separates the emitter layer from the drift layer. This manufacturing method includes preparing a semiconductor wafer that includes a first layer, and a second layer that is layered on a back surface of the first layer and that has a higher polycrystalline silicon concentration than the first layer; and forming the buffer layer by implanting and diffusing ions in the second layer.

According to this manufacturing method, the buffer layer is formed by implanting and diffusing ions in the second layer. The second layer has a higher polycrystalline silicon concentration and a higher ion diffusion coefficient than the first layer. Therefore, the thickness of the buffer layer is able to be sufficiently ensured without keeping the semiconductor wafer at a high temperature for an extended period of time. The buffer layer is able to be made sufficiently thick due to an annealing condition in which a device structure that has already been formed by the preparing is not polluted. Therefore, even if a thin portion of the buffer layer occurs locally, the voltage resistance of the semiconductor device is able to be ensured.

Also, a second aspect of the invention relates to a manufacturing method for the semiconductor device described above. This manufacturing method includes preparing a semiconductor wafer that includes a first layer that has the drift layer, the body layer, and the emitter layer, and on which the gate electrode is formed, and a second layer that is formed by noble gas ion implantation on a back surface of the first layer, and that has a higher polycrystalline silicon concentration than the first layer; and forming the buffer layer by implanting and diffusing impurity ions of a first conductivity type in the second layer.

Similar to the manufacturing method of the first aspect described above, the buffer layer is formed by implanting and diffusing impurity ions of a first conductivity type in the second layer that has a higher polycrystalline silicon concentration than the first layer. Therefore, the buffer layer is able to be made sufficiently thick by an annealing condition in which the device structure that has already been formed is not polluted, so the voltage resistance of the semiconductor device is able to be ensured.

Also, a third aspect of the invention relates to a semiconductor device. This semiconductor device includes a drift layer of a first conductivity type; a body layer of a second conductivity type that contacts a front surface of the drift layer, and a portion of which is exposed on a front surface of a semiconductor substrate; an emitter layer of a first conductivity type that is provided on a portion of a front surface of the body layer, and is exposed on the front surface of the semiconductor substrate, and that is separated from the drift layer by the body layer; a buffer layer of a first conductivity type that contacts a back surface of the drift layer; a collector layer of a first conductivity type that contacts a back surface of the buffer layer and is exposed on a back surface of the semiconductor substrate; and a gate electrode that faces, via an insulating film, the body layer in an area where the body layer separates the emitter layer from the drift layer. The semiconductor substrate includes a first layer, and a second layer that is layered on a back surface of the first layer, and has a higher polycrystalline silicon concentration than the first layer. The buffer layer is formed on at least a portion of the second layer, and a peak of an impurity concentration of a first conductivity type of the buffer layer is positioned at an interface of the first layer and the second layer.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
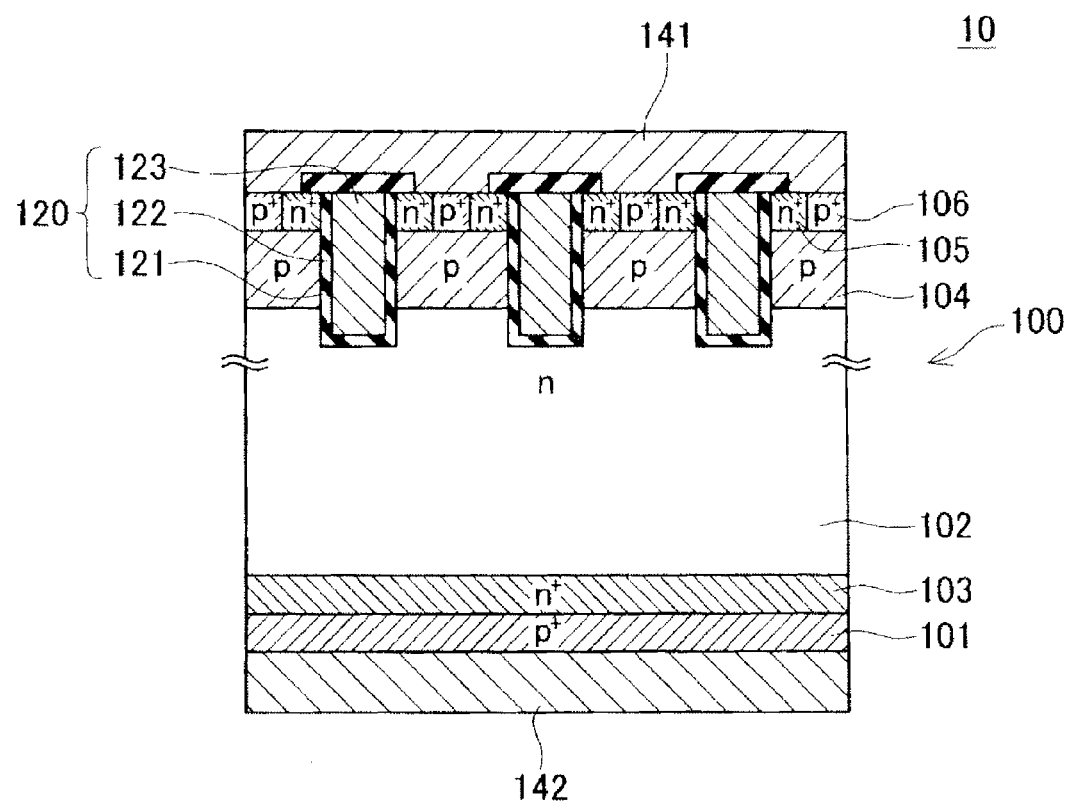
FIG. 1 is a sectional view of a semiconductor device manufactured by a manufacturing method according to a first example embodiment of the invention.

FIG. 1 is a view of an example of a semiconductor device manufactured by a manufacturing method described in this specification. In the description referring to FIG. 1 and the other drawings, the upper side in the drawings may be referred to as the front surface of the semiconductor or the like, and the lower side in the drawings may be referred to as the back surface of the semiconductor or the like. A semiconductor device 10 includes a semiconductor substrate 100, a front surface electrode 141 that contacts a front surface of the semiconductor substrate 100, and a back surface electrode 142 that contacts a back surface of the semiconductor substrate 100. The semiconductor substrate 100 includes a p-type collector layer 101, an n-type buffer layer 103, an n-type drift layer 102, a p-type first body layer 104, an n-type emitter layer 105, and a p-type second body layer 106. The first body layer 104 contacts the front surface of the drift layer 102. The second body layer 106 is provided on a portion of the front surface of the first body layer 104, and is exposed on the front surface of the semiconductor substrate 100. The emitter layer 105 is provided on a portion of the front surface of the first body layer 104, and is exposed on the front surface of the semiconductor substrate 100, and is separated from the drift layer 102 by the first body layer 104. The buffer layer 103 contacts the back surface of the drift layer 102. The collector layer 101 contacts the back surface of the buffer layer 103 and is exposed on the back surface of the semiconductor substrate 100. The emitter layer 105 and the second body layer 106 contact the front surface electrode 141. The collector layer 101 contacts the back surface electrode 142. The semiconductor substrate 100 is a layered substrate that has a monocrystalline silicon layer on the front surface side, and polysilicon layer on the back surface side. The collector layer 101 and the buffer layer 103 are formed inside the polysilicon layer. The drift layer 102, the first body layer 104, the emitter layer 105, and the second body layer 106 are formed inside the monocrystalline silicon layer. An interface between the buffer layer 103 and the drift layer 102 is aligned with an interface between the polysilicon layer and the monocrystalline silicon layer. As will be described later, an n-type impurity concentration in the buffer layer 103 is substantially constant, and has a steep peak at the interface between the buffer layer 103 and the drift layer 102.

A trench gate 120 is formed on the front surface side of the semiconductor substrate 100. The trench gate 120 includes a trench 121 that extends from the front surface of the semiconductor substrate 100, through the first body layer 104, to the drift layer 102, a gate insulating film 122 formed on an inner wall surface of the trench 121, and a gate electrode 123 that is covered by the gate insulating film 122 and is filled inside the trench 121. The gate electrode 123 faces, via the gate insulating film 122, the first body layer 104 in an area where the first body layer 104 separates the emitter layer 105 from the drift layer 102.

Figure 2:
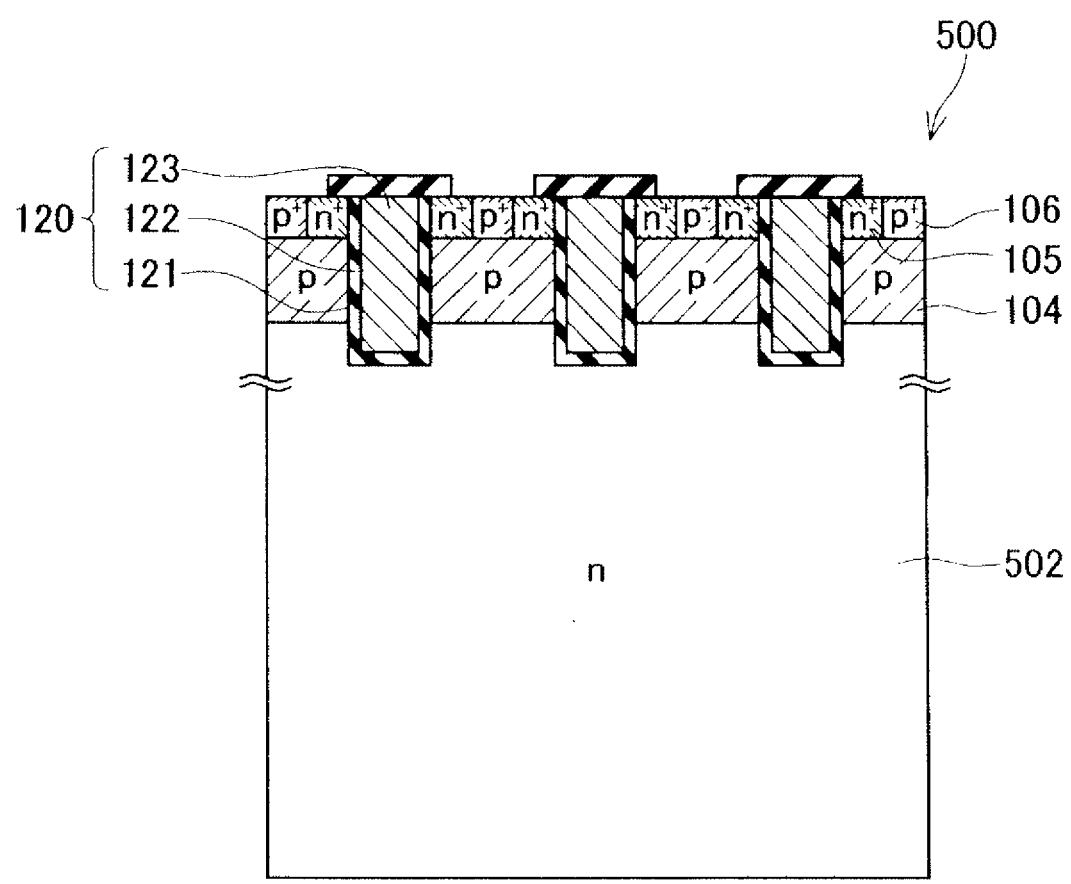
FIG. 2 is a view of a manufacturing process of the semiconductor device according to the first example embodiment of the invention.

FIGS. 2 to 6 are views of an example of a manufacturing method of the semiconductor device 10. In this manufacturing method, first, as shown in FIG. 2, an n-type semiconductor wafer 500 on which a front surface structure (this front surface structure is similar to that in FIG. 1, so a description thereof will be omitted) of the semiconductor device 10 is formed is prepared. This semiconductor wafer 500 is a monocrystalline silicon substrate. The first body layer 104, the second body layer 106, and the emitter layer 105 are formed by a method involving ion implantation into the monocrystalline silicon substrate, for example. An n-layer 502 of the semiconductor wafer 500 is a layer that will become the drift layer 102. The semiconductor wafer 500 shown in FIG. 2 is one example of a first layer in the manufacturing method described in this specification. That is, the first layer includes a layer that has a drift layer, a body layer, and an emitter layer, and on which a gate electrode is formed.

Figure 3:
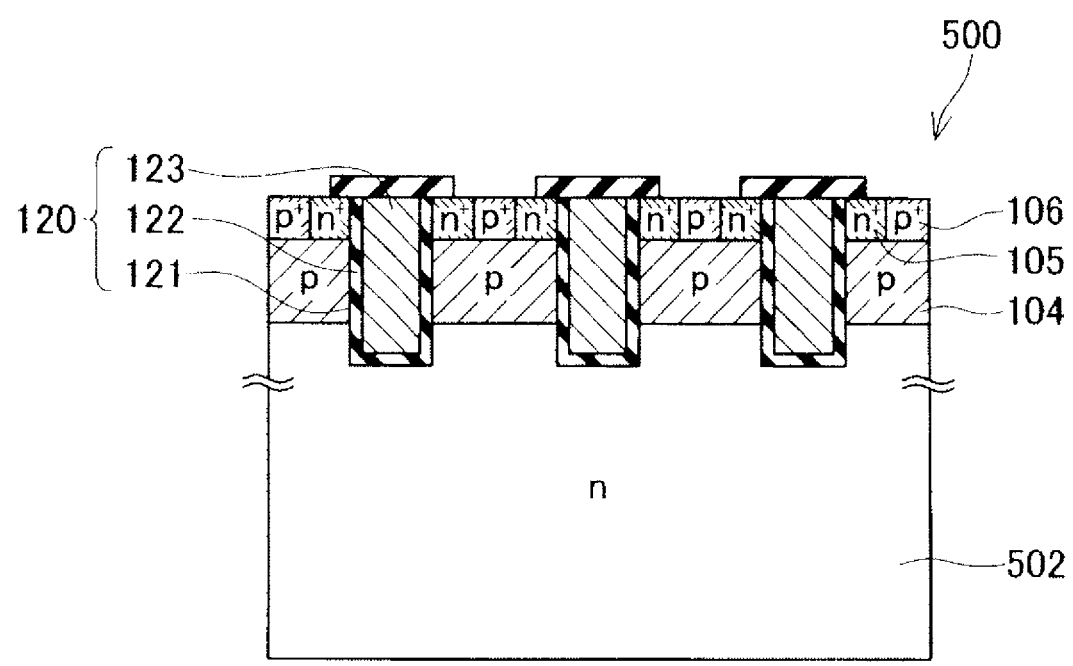
FIG. 3 is a view of the manufacturing process of the semiconductor device according to the first example embodiment of the invention.

Next, the back surface of the semiconductor wafer 500 is ground to reduce the thickness of the n-layer 502 to approximately the thickness of the drift layer 102, as shown in FIG. 3.

Figure 4:
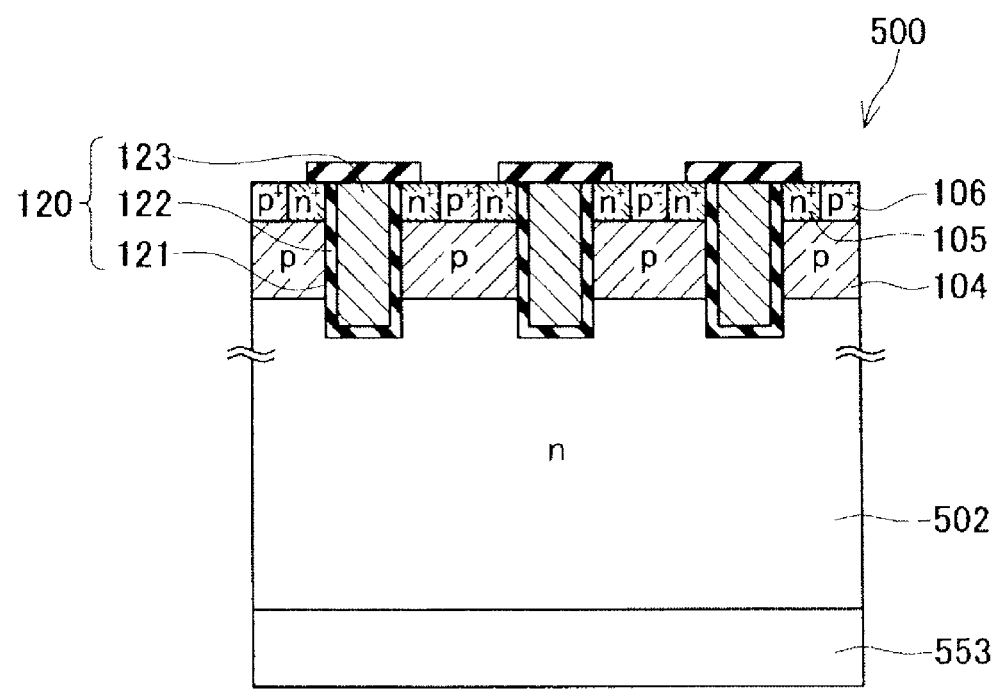
FIG. 4 is a view of the manufacturing process of the semiconductor device according to the first example embodiment of the invention.

Next, a polysilicon layer 553 is layered on the back surface of the semiconductor wafer 500, as shown in FIG. 4. This polysilicon layer 553 may be formed by a solid phase epitaxial growth method. The polysilicon layer 553 is one example of a second layer in the manufacturing method described in this specification, and has a higher polycrystalline silicon concentration than the semiconductor wafer 500 that is one example of the first layer.

Figure 5:
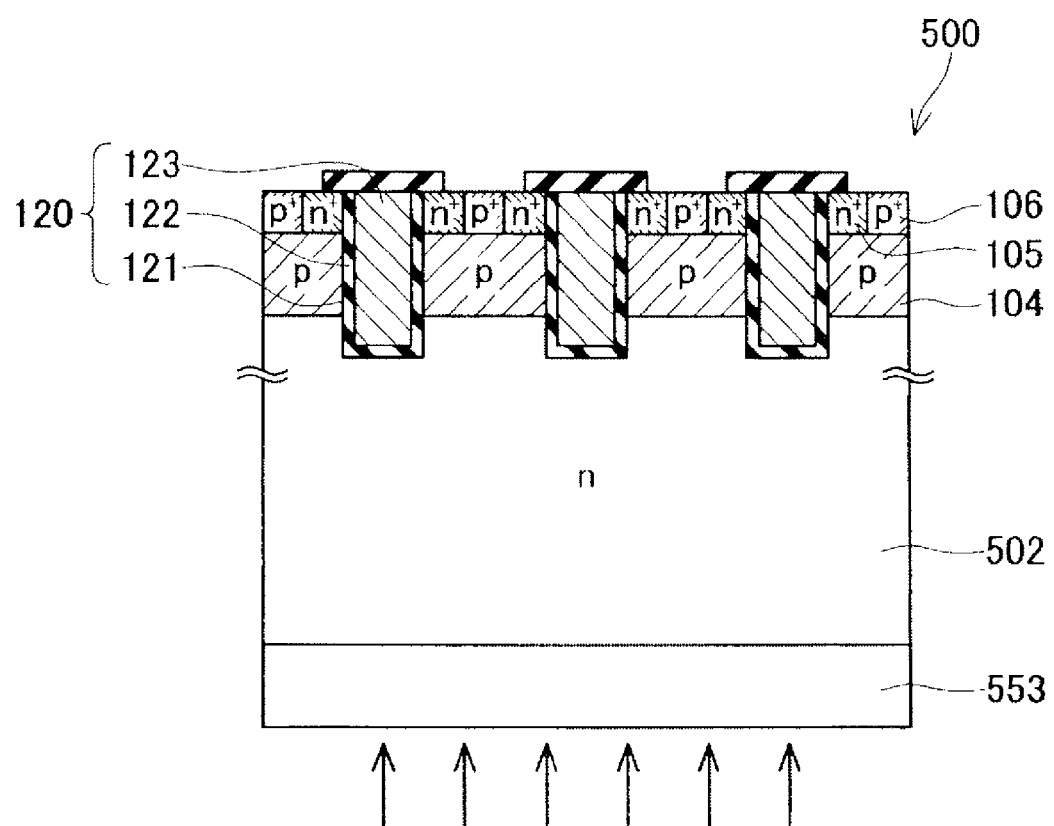
FIG. 5 is a view of the manufacturing process of the semiconductor device according to the first example embodiment of the invention.

Next, ion implantation into the polysilicon layer 553 is performed from the back surface side of the polysilicon layer 553, as shown in FIG. 5. First, n-type ion implantation is performed at a comparatively deep position (a position closer to the n-layer 502) from the back surface side of the polysilicon layer 553. Then p-type ion implantation is performed at a shallower position on the back surface side of the polysilicon layer 553.

Figure 6:
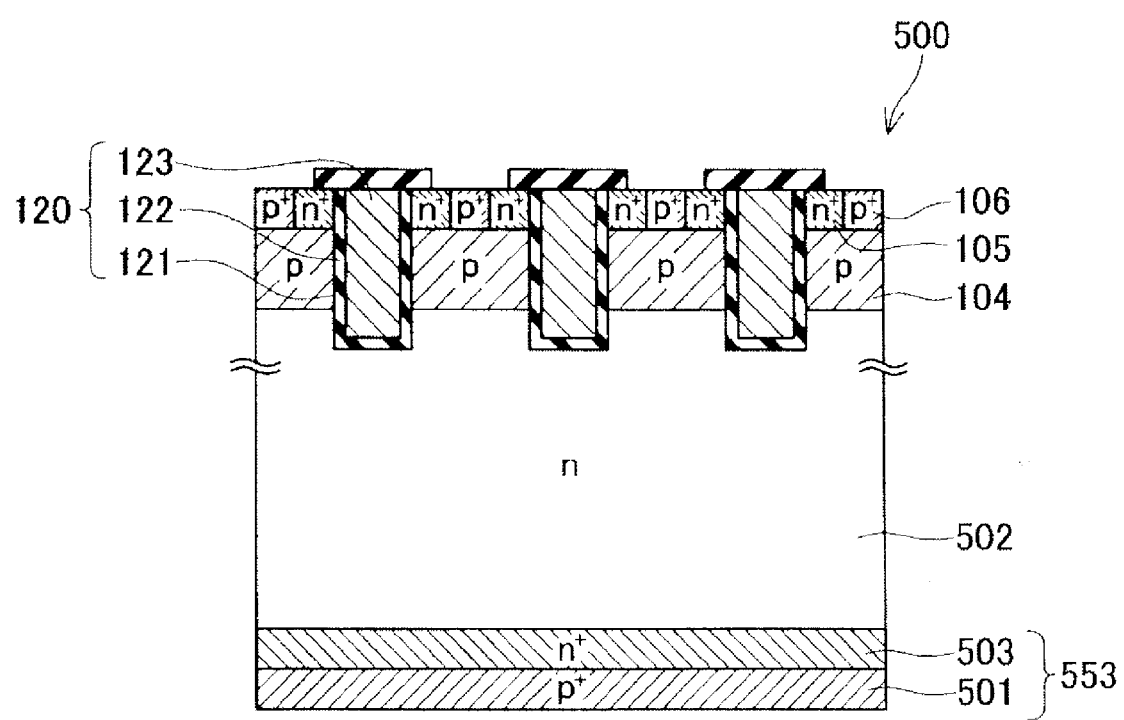
FIG. 6 is a view of the manufacturing process of the semiconductor device according to the first example embodiment of the invention.

Next, the polysilicon layer 553 of the semiconductor wafer 500 is locally annealed by laser annealing. As a result, an n-layer 503 that contacts the back surface of the n-layer 502, and a p-layer 501 that contacts the back surface of the n-layer 503 and is exposed on the back surface of the semiconductor wafer 500 are formed, as shown in FIG. 6. The n-type impurity concentration of the n-layer 503 is higher than the n-type impurity concentration of the n-layer 502. The n-layer 503 and the p-layer 501 are layers that will become the buffer layer 103 and the collector layer 101, respectively, of the semiconductor device 10.

Figure 7:
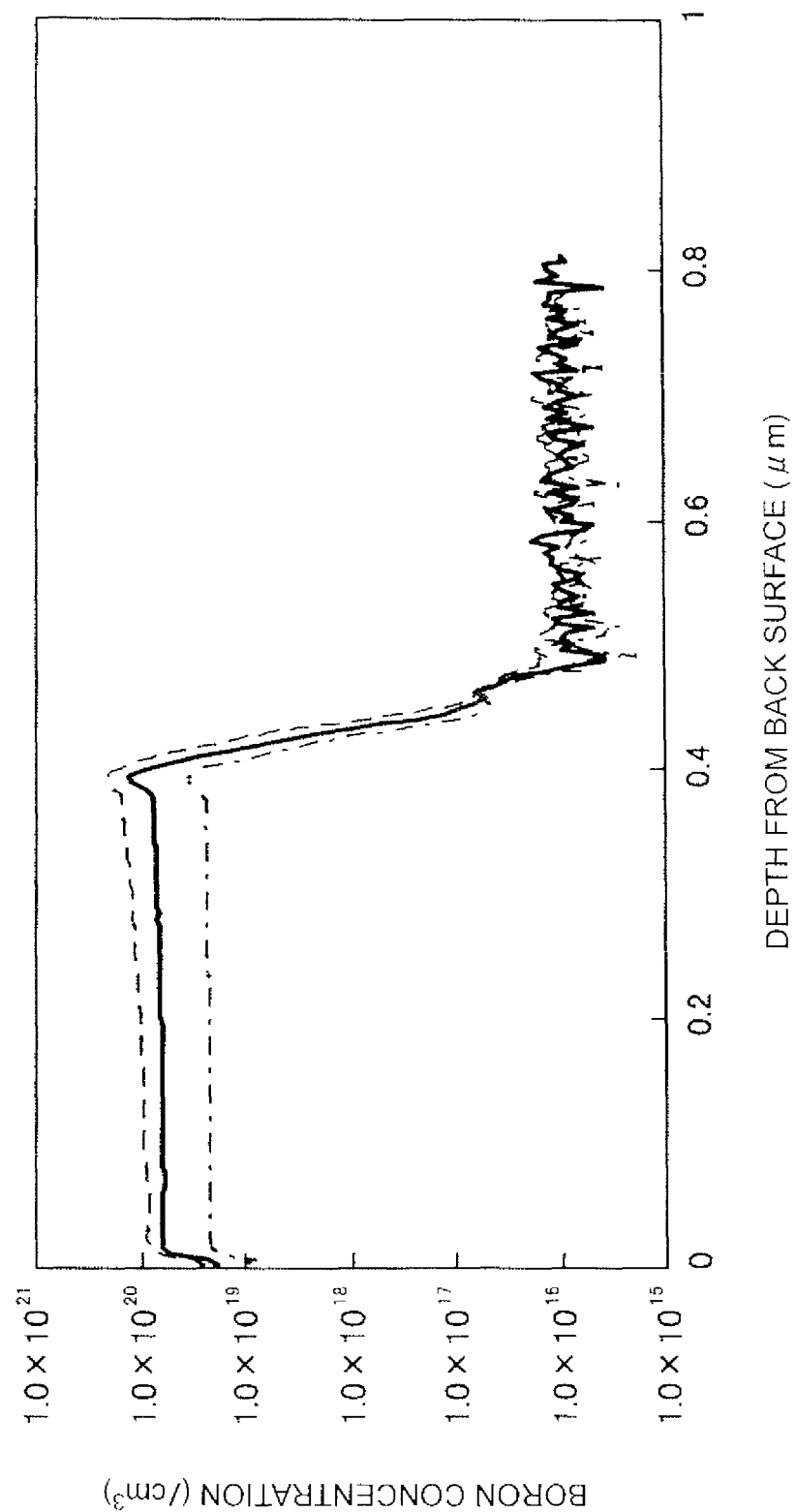
FIG. 7 is a graph showing a distribution of an impurity concentration in a depth direction of a polysilicon layer.
Figure 8:
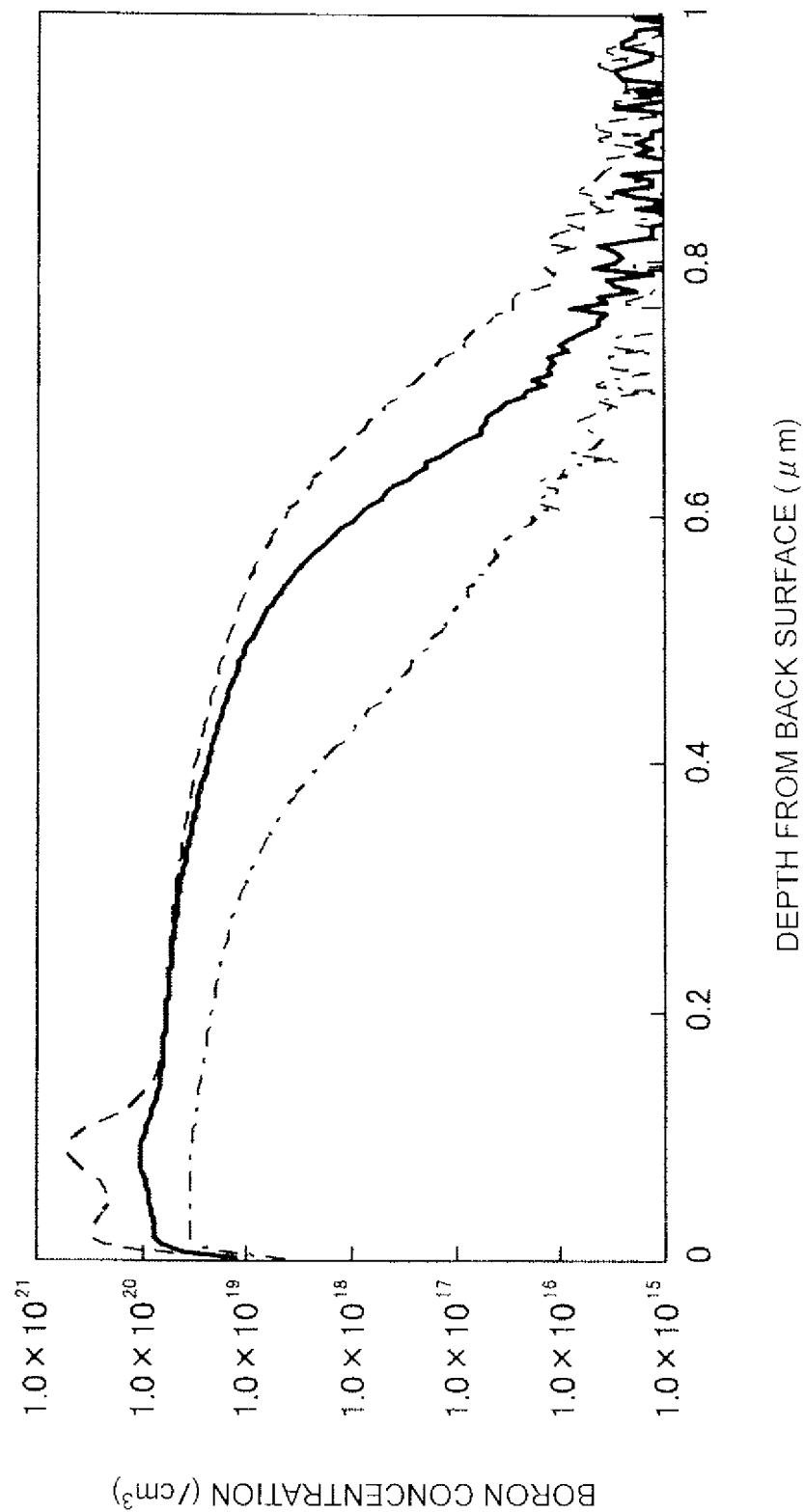
FIG. 8 is a graph showing a distribution of an impurity concentration in a depth direction of a monocrystalline silicon substrate.

FIGS. 7 and 8 are views of a distribution of the impurity concentration when p-type impurities (boron) are implanted under the same conditions, into a polysilicon layer (formed by a solid phase epitaxial method) and a monocrystalline silicon substrate, and annealing is performed under the same conditions. The vertical axis represents the concentration of boron ions, and the horizontal axis represents the depth from the back surface side where ion implantation is performed. Boron implantation is performed under three types of conditions. The broken line, solid line, and the alternate long and short dash line show the results when boron is implanted under the conditions of $1\times10^{15}/cm^2$, $3\times10^{15}/cm^2$, and $5\times10^{15}/cm^2$, respectively.

As shown in FIG. 8, under all of the boron implantation conditions, with the monocrystalline silicon substrate, the impurity concentration spreads in the depth direction from the back surface side (i.e., the ion implantation surface side) of the substrate in a Gaussian distribution shape. In contrast, under all of the boron implantation conditions, with the polysilicon layer, the impurity concentration shows a rectangular-shaped distribution, and the impurity concentration is substantially constant near the back surface side, as shown in FIG. 7. This is because the diffusion coefficient of the impurities in the polysilicon layer is higher than it is in the monocrystalline silicon substrate. This indicates that even with the same ion implantation and annealing conditions, the impurities diffuse faster in the polysilicon layer.

Also, when the polysilicon layer is used, a peak in the boron concentration is observed where the depth from the back surface is approximately 0.4 μm, as shown in FIG. 7. This indicates that when the boron diffuses, impurity ions become trapped at the interface between the polysilicon layer and the monocrystalline silicon layer, so the impurity concentration increases at this interface. By implanting more n-type impurity ions in a region near the monocrystalline silicon layer of this polysilicon layer, an n-type buffer layer is able to be formed at a portion inside the polysilicon layer. In this case, the peak of the n-type impurity concentration of the buffer layer is positioned at the interface between the polysilicon layer and the monocrystalline silicon layer.

As described above, with the manufacturing method according to the first example embodiment, the buffer layer 103 is formed by implanting and diffusing ions in the polysilicon layer 553. The polysilicon layer 553 has a higher polycrystalline silicon concentration, and a higher ion diffusion coefficient, than the semiconductor wafer 500 that is the monocrystalline silicon substrate. Therefore, the thickness of the buffer layer 103 is able to be sufficiently ensured even if the semiconductor wafer 500 is not maintained at a high temperature for an extended period of time. The buffer layer 103 is able to be made sufficiently thick due to an annealing condition in which the front surface structure of the semiconductor device 10 that has already been formed is not polluted. Therefore, even if a thin portion of the buffer layer 103 occurs locally, the voltage resistance of the semiconductor device 10 is able to be ensured. An amorphous silicon layer may also be used instead of the polysilicon layer 553. The diffusion coefficient of the impurity ions becomes higher closer to the amorphous silicon, and lower closer to the monocrystalline silicon.

Also, as in the first example embodiment, when ion implantation into the polysilicon layer that is layered on the back surface of the semiconductor wafer 500 is performed by a solid phase epitaxial method, a rectangular-shaped impurity concentration distribution such as that in FIG. 7 is obtained. Therefore, it becomes easy to adjust the depth and impurity concentration of the collector layer and the buffer layer. When ion implantation into the polysilicon layer is performed, and it is desirable to change the impurity concentration distribution in a stepped manner, a plurality of layers having different impurity ion diffusion coefficients of may be layered. For example, a plurality of polycrystalline silicon layers may be layered such that the diffusion coefficient gradually becomes lower in the depth direction from the ion implantation surface side. As a result, the impurity concentration is able to be reduced in a stepped manner in the depth direction from the ion implantation surface side.

Also, in the example embodiment described above, the second body layer 106 that has a higher p-type impurity concentration than the first body layer 104 is exposed on the front surface of the semiconductor substrate 100, but the invention is not limited to this. That is, the second body layer 106 may be omitted, and a portion of the first body layer 104 may be exposed on the front surface of the semiconductor substrate 100.

In the description above, the second layer that has a high polycrystalline silicon concentration is formed layered as another phase on the first layer, but the invention is not limited to this. For example, the polycrystalline silicon concentration of a portion of the first layer can be increased by implanting noble gas ions into the first layer, and this can be used as the second layer. The noble gas ions may be ions of helium or argon or the like, for example, but are not limited to these.

Also, in the description above, a case in which the first layer is a monocrystalline silicon substrate is given as an example, but the invention is not limited to this. That is, the first layer and the second layer need simply be a combination in which the second layer has a higher polycrystalline silicon concentration than the first layer. That is, the impurity diffusion coefficient need only be higher in the second layer than it is in the first layer.

While the invention has been described with reference to specific embodiments thereof, these example embodiments are for illustrative purposes only and are not intended to limit the scope of the claims for patent. Various modifications and variations of the specific examples described above are also included in the technology described in the scope of the claims for patent.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A manufacturing method for a semiconductor device that includes a drift layer of a first conductivity type; a body layer of a second conductivity type that contacts a front surface of the drift layer, and a portion of which is exposed on a front surface of a semiconductor substrate; an emitter layer of the first conductivity type that is provided on a portion of a front surface of the body layer, and is exposed on the front surface of the semiconductor substrate, and that is separated from the drift layer by the body layer; a buffer layer of the first conductivity type that contacts a back surface of the drift layer; a collector layer of the second conductivity type that contacts a back surface of the buffer layer and is exposed on a back surface of the semiconductor substrate; and a gate electrode that faces, via an insulating film, the body layer in an area where the body layer separates the emitter layer from the drift layer, the manufacturing method comprising:

preparing a semiconductor wafer that includes (1) a first layer that is a monocrystalline silicon substrate, and (2) a second layer that is a polysilicon layer or an amorphous silicon layer, is layered on a back surface of the first layer, and has a higher polycrystalline silicon concentration than the first layer;

forming, in the second layer, the buffer layer by implanting and diffusing ions of the first conductivity type; and forming in the second layer, the collector layer by implanting ions of the second conductivity type such that the collector layer contacts the back surface of the buffer layer.

2. The manufacturing method for a semiconductor device according to claim 1, wherein the first layer includes a layer that has the drift layer, the body layer, and the emitter layer, and on which the gate electrode is formed.

3. A manufacturing method for a semiconductor device that includes a drift layer of a first conductivity type; a body layer of a second conductivity type that contacts a front surface of the drift layer, and a portion of which is exposed on a front surface of a semiconductor substrate; an emitter layer of the first conductivity type that is provided on a portion of a front surface of the body layer, and is exposed on the front surface of the semiconductor substrate, and that is separated from the drift layer by the body layer; a buffer layer of the second conductivity type that contacts a back surface of the drift layer; a collector layer of the first conductivity type that contacts a back surface of the buffer layer and is exposed on a back surface of the semiconductor substrate; and a gate electrode that faces, via an insulating film, the body layer in an area where the body layer separates the emitter layer from the drift layer, the manufacturing method comprising:

preparing a semiconductor wafer that includes (1) a first layer that is a monocrystalline silicon substrate and that has the drift layer, the body layer, and the emitter layer, and on which the gate electrode is formed, and (2) a second layer that is a polysilicon layer or an amorphous silicon layer, is formed by noble gas ion implantation on a back surface of the first layer, and has a higher polycrystalline silicon concentration than the first layer;

forming, in the second layer, the buffer layer by implanting and diffusing impurity ions of a first conductivity type; and forming, in the second layer, the collector layer by implanting ions of the second conductivity type such that the collector layer contacts the back surface of the buffer layer.

* * * * *